United States Patent
Meng et al.

(10) Patent No.: US 12,150,351 B2
(45) Date of Patent: Nov. 19, 2024

(54) CHIP-ON-FILM BONDING STRUCTURE HAVING A FIRST EXPOSED REGION OF THE FIRST PIN AND A SECOND EXPOSED REGION OF THE SECOND PIN IN A DISPLAY MODULE

(71) Applicants: Chengdu BOE Optoelectronics Technology Co., Ltd., Chengdu (CN); BOE Technology Group Co., Ltd., Beijing (CN)

(72) Inventors: Huan Meng, Beijing (CN); Xiaolong Zhu, Beijing (CN); Hao Huang, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 725 days.

(21) Appl. No.: 17/417,577

(22) PCT Filed: Oct. 12, 2020

(86) PCT No.: PCT/CN2020/120416
§ 371 (c)(1),
(2) Date: Jun. 23, 2021

(87) PCT Pub. No.: WO2021/082894
PCT Pub. Date: May 6, 2021

(65) Prior Publication Data
US 2022/0059642 A1    Feb. 24, 2022

(30) Foreign Application Priority Data
Oct. 28, 2019    (CN) .......................... 201911032346.9

(51) Int. Cl.
*H10K 59/131*    (2023.01)
*H05K 1/18*    (2006.01)
*H10K 59/12*    (2023.01)

(52) U.S. Cl.
CPC ........... *H10K 59/131* (2023.02); *H05K 1/189* (2013.01); *H05K 2201/10128* (2013.01); *H10K 59/1201* (2023.02)

(58) Field of Classification Search
CPC ............ H10K 59/131; H10K 59/1201; H10K 59/1315; H05K 1/189; H05K 2201/10128; H01L 27/1244
See application file for complete search history.

(56) References Cited

U.S. PATENT DOCUMENTS

| | | | |
|---|---|---|---|
| 7,696,286 B2* | 4/2010 | Endo | ................ H01L 23/293 |
| | | | 525/481 |
| 9,340,700 B2* | 5/2016 | Iwashige | ................ C08L 63/00 |

(Continued)

FOREIGN PATENT DOCUMENTS

| CN | 204634159 U | 9/2015 |
|---|---|---|
| CN | 108495455 A | 9/2018 |

(Continued)

OTHER PUBLICATIONS

PCT/CN2020/120416 International Search Report and Written Opinion.

Primary Examiner — Caleb E Henry
(74) Attorney, Agent, or Firm — IPro, PLLC

(57) ABSTRACT

The present disclosure relates to a chip-on-film bonding structure, a display module, and a terminal equipment. The chip-on-film bonding structure includes: a chip on film including a first pin, the first pin including a first end and a second end that are arranged to be opposite to each other; and a flexible circuit board including a second pin connected to the first pin, the second pin including a third end and a (Continued)

fourth end that are arranged to be opposite to each other; in which the first end and the third end overlap to form a first active contact region; and the second end and the fourth end respectively extend outward from two opposite sides of the first active contact region, to form a first exposed region at the second end and to form a second exposed region at the fourth end.

19 Claims, 1 Drawing Sheet

(56) References Cited

U.S. PATENT DOCUMENTS

| | | | | |
|---|---|---|---|---|
| 2007/0043166 | A1* | 2/2007 | Hoshika | H01L 23/293 |
| | | | | 524/763 |
| 2010/0220072 | A1* | 9/2010 | Chien | G06F 3/04164 |
| | | | | 345/173 |
| 2018/0124933 | A1* | 5/2018 | Park | H10K 59/00 |
| 2019/0164901 | A1* | 5/2019 | Liu | H01L 27/124 |
| 2020/0209672 | A1* | 7/2020 | Wu | G02F 1/13458 |
| 2021/0020703 | A1* | 1/2021 | Oh | H10K 59/124 |
| 2021/0118350 | A1* | 4/2021 | Yang | G09G 3/20 |
| 2021/0124202 | A1* | 4/2021 | Pan | G02F 1/1333 |
| 2022/0102689 | A1* | 3/2022 | Jiang | H10K 50/844 |
| 2022/0404405 | A1* | 12/2022 | Wang | G09F 9/30 |

FOREIGN PATENT DOCUMENTS

| | | |
|---|---|---|
| CN | 109597508 A | 4/2019 |
| CN | 109686712 A | 4/2019 |
| CN | 110707136 A | 1/2020 |
| CN | 210073288 U | 2/2020 |

* cited by examiner

CHIP-ON-FILM BONDING STRUCTURE HAVING A FIRST EXPOSED REGION OF THE FIRST PIN AND A SECOND EXPOSED REGION OF THE SECOND PIN IN A DISPLAY MODULE

CROSS-REFERENCE TO RELATED APPLICATION

This application is the U.S. national phase of PCT Application No. PCT/CN2020/120416 filed on Oct. 12, 2020, which claims a priority to Chinese Patent Application No. 201911032346.9 filed on Oct. 28, 2019, the disclosures of which are incorporated in their entirety by reference herein.

TECHNICAL FIELD

The present disclosure relates to the field of display technology, in particular, to a chip-on-film bonding structure, a display module, and a terminal equipment.

BACKGROUND

The current process for manufacturing an organic light emitting diode (OLED) display module is very complicated. With the increase in the diversity of its functional requirements and the reduction of its volume size, the requirements on the laser cutting process, bonding process and attaching process of the display module are getting higher and higher, and the precision requirement of each process is getting higher and higher.

SUMMARY

The present disclosure provides the following technical solutions.

An embodiment of the present disclosure provides a chip on film bonding structure, including: a chip on film including a first pin, in which the first pin comprises a first end and a second end that are arranged to be opposite to each other; and a flexible circuit board including a second pin connected to the first pin, in which the second pin includes a third end and a fourth end that are arranged to be opposite to each other, in which the first end of the first pin and the third end of the second pin overlap with each other to form a first active contact region, and the second end of the first pin and the fourth end of the second pin respectively extend outward from two opposite sides of the first active contact region, to form a first exposed region at the second end of the first pin and to form a second exposed region at the fourth end of the second pin.

Optionally, the first exposed region has a first length in an extending direction from the first end to the second end; the second exposed region has a second length in the extending direction from the third end to the fourth end; and both the first length and the second length are less than 0.3 mm.

Optionally, the second length is in a range from 0.05 to 0.20 mm.

Optionally, the first length is 0.1 mm.

Optionally, the second length is in a range from 0.1 to 0.2 mm.

Optionally, the second length is 0.1 mm.

Optionally, the chip on film includes: a substrate; a metal layer, arranged on two opposite surfaces of the substrate and connected to the driving IC; a paint film, arranged on a surface of the metal layer away from the substrate and exposing two ends of the metal layer, in which the exposed two ends are the first pin and a third pin to be connected to a display substrate, and the third pin includes a fifth end and a sixth end that are arranged to be opposite to each other.

Optionally, the chip-on-film bonding structure further includes a display substrate including a fourth pin to be connected to the chip on film, and the fourth pin includes a seventh end and an eighth end that are arranged to be opposite to each other.

Optionally, the fifth end of the third pin and the seventh end of the fourth pin overlap with each other to form a second active contact region; and the sixth end of the third pin and the eighth end of the fourth pin respectively extend outward from two opposite sides of the second active contact region, to form a third exposed region at the sixth end of the third pin and to form a fourth exposed region at the eighth end of the fourth pin.

Optionally, the third exposed region has a third length in an extending direction from the fifth end to the sixth end; the fourth exposed region has a fourth length in the extending direction from the seventh end to the eighth end; and both the third length and the fourth length are less than 0.3 mm.

Optionally, the third length is in a range from 0.05 to 0.20 mm, optionally 0.1 mm; and/or the fourth length is in a range from 0.1 to 0.2 mm, optionally 0.1 mm.

An embodiment of the present disclosure further provides a display module including the chip-on-film bonding substrate as described above.

Optionally, the display module is an OLED display module.

An embodiment of the present disclosure further provides a terminal equipment including the display module as described above.

An embodiment of the present disclosure further provides a method for bonding the chip-on-film bonding structure, the chip-on-film bonding structure includes: a chip on film including a first pin, in which the first pin includes a first end and a second end that are arranged to be opposite to each other; and a flexible circuit board including a second pin connected to the first pin, in which the first pin includes a third end and a fourth end that are arranged to be opposite to each other, the method includes: forming a first active contact region by overlapping the first end of the first pin and the third end of the second pin; and forming a first exposed region at the second end of the first pin and forming a second exposed region at the fourth end of the second pin by respectively extending the second end of the first pin and the fourth end of the second pin outward from two opposite sides of the first active contact region.

Optionally, in the above method, the first exposed region has a first length in an extending direction from the first end to the second end; the second exposed region has a second length in the extending direction from the third end to the fourth end; and both the first length and the second length are less than 0.3 mm.

Optionally, the first length is in a range from 0.05 to 0.20 mm, optionally 0.1 mm; and/or the second length is in a range from 0.1 to 0.2 mm, optionally 0.1 mm.

Optionally, in the above method, the chip on film includes: a substrate; a metal layer, arranged on two opposite surfaces of the substrate and connected to the driving IC; a paint film, arranged on a surface of the metal layer away from the substrate and exposing two ends of the metal layer, the exposed two ends are the first pin and a third pin to be connected to a display substrate, the third pin includes a fifth end and a sixth end that are arranged to be opposite to each other.

Optionally, in the above method, the chip-on-film bonding structure further includes a display substrate including a fourth pin to be connected to the chip on film, and the fourth pin includes a seventh end and an eighth end that are arranged to be opposite to each other.

Optionally, the method further includes: forming a second active contact region by overlapping the fifth end of the third pin and the seventh end of the fourth pin; and forming a third exposed region at the sixth end of the third pin and forming a fourth exposed region at the eighth end of the fourth pin by respectively extending the sixth end of the third pin and the eighth end of the fourth pin outward from two opposite sides of the second active contact region.

Optionally, in the above method, the third exposed region has a third length in an extending direction from the fifth end to the sixth end; the fourth exposed region has a fourth length in the extending direction from the seventh end to the eighth end; and both the third length and the fourth length are less than 0.3 mm.

Optionally, the third length is in a range from 0.05 to 0.20 mm, optionally 0.1 mm; and/or the fourth length is in a range from 0.1 to 0.2 mm, optionally 0.1 mm.

DETAILED DESCRIPTION

Figure 1:
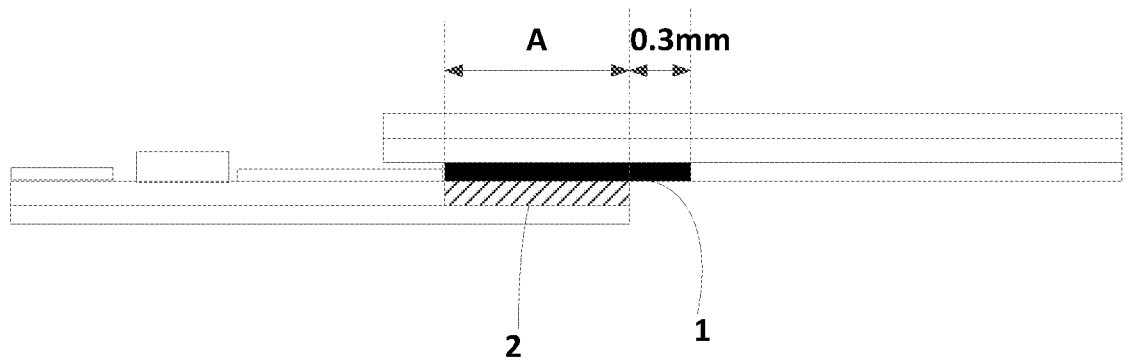
FIG. 1 is a schematic view showing a chip-on-film bonding structure in the related art.

In order to illustrate the purposes, technical solution and advantages in the embodiments of the present disclosure in a clearer manner, the technical solutions in the embodiments of the present disclosure will be described hereinafter in conjunction with the drawings in the embodiments of the present disclosure in a clear and complete manner. Obviously, the following embodiments relate to a part of, rather than all of, the embodiments of the present disclosure. Based on the described embodiments of the present disclosure, a person skilled in the art may, without any creative effort, obtain the other embodiments, which also fall within the scope of the present disclosure.

Unless otherwise defined, technical terms or scientific terms used herein have the normal meaning commonly understood by one skilled in the art in the field of the present disclosure. The words "first", "second", and the like used herein does not denote any order, quantity, or importance, but rather merely serves to distinguish different components. Similarly, the words "a", "an", "the" and the like do not denote any quantitative limitation, but rather denote at least one. The "including", "comprising", and the like used in the present disclosure means that the element or item appeared in front of the word encompasses the element or item and their equivalents listed after the word, and does exclude other elements or items. The word "connected" or "connecting" and the like are not limited to physical or mechanical connections, but may include electrical connections, whether direct or indirect. "On", "under", "left", "right" and the like are only used to represent relative positional relationships, and when the absolute position of the described object is changed, the relative positional relationship may also be changed, accordingly.

Currently, chip-on-film or chip on flex (COF) technology has been used in OLED display modules to achieve ultra-narrow borders. The chip-on-film technology is a technology that bonds the pads on the driver chip with the pins on the flexible circuit board through thermal compression. The flexible circuit board includes a substrate, a metal layer and a paint film. The paint film exposes both ends of the metal layer, in which a part of the exposed ends is bound to the display substrate, and the other part (COF Pin) is bound to the pin of the flexible circuit board FPC. In the current COF technology of OLED display modules, the exposed part of the FPC pin is susceptible to corrosion, thereby causing the display module to occur defects, and affecting the module product yield and product life.

The beneficial effects of the present disclosure are shown as follows:

In the above technical solution, the first pin of the flexible circuit board extends out of the first active contact region formed between the first pin and the second pin of the flexible circuit board. That is, the first pin is designed to have a length greater than that of the first active contact region. As compared with an embodiment in which only the FPC Pin is exposed but the COF Pin is not exposed (i.e., the length of the COF Pin is equal to the length of the first active contact region), the first pin of the chip-on-film COF is designed to have a length greater than that of the first active contact region. In this way, since the length of the COF pin (first pin) is increased, the exposed part of the FPC Pin (the second pin) can be reduced when the length of the first active contact region of the first pin and the second pin remains unchanged. This can meet the requirements on a process for bonding FPC with COF, and at the same time can alleviate the corrosion problem of the exposed part of FPC pin. Therefore, the above embodiment is conductive to reduce the poor display, improve reliability, and increase product service life.

As shown in FIG. 1, at present, in the FOF bonding process (a process for bonding COF with FPC) of the OLED display module, COF pin 2 and FPC pin 1 need to be in full contact. In other words, the first active contact region of COF pin 2 and FPC pin 1 needs to have a certain length (shown as "A" in FIG. 1 is the first active contact region). Since there are a location tolerance and a dimensional tolerance for a product in the current bonding device, the length of FPC Pin 1 is longer than the length of COF Pin 2, as shown in FIG. 1, in order to ensure that the first active contact region A of the FPC pin 1 and the COF pin 2 has a certain length. For example, the length of FPC Pin 1 shown in FIG. 1 is about 0.30 mm longer than the length of COF Pin 2; and FPC pin 1 has an end flush with one end of COF pin 2 and the other end exposed, while the COF pin is not exposed at all. Over time, the exposed part of FPC Pin 2 will be oxidized and corroded, and even cracks and other defects will occur, which will cause the line to peel off and the resistance to increase. This will cause the display screen to display abnormally, cause dot defects, bright lines, etc., and local generating heat problems, all of which will seriously affect the product yield and the product life of the module products.

In view of the problems in the FOF bonding process of OLED display devices that the product life is affected due to the exposed part of the FPC Pin being easily oxidized and corroded, the embodiments of the present disclosure provide a chip-on-film bonding structure, a display module, a terminal equipment, and a method for bonding the chip-on-film bonding structure, which effectively alleviates the problem of corrosion of the exposed part of the FPC pin, is conductive to reduce the poor display, improves reliability, and increases the product life, when meeting the requirements of the FPC and COF bonding process.

Figure 2:
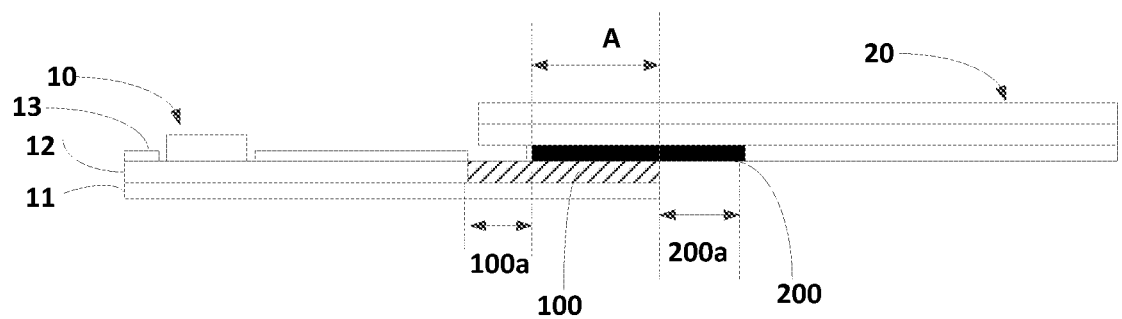
FIG. 2 is a schematic view showing a chip-on-film bonding structure according to one embodiment of the present disclosure.

As shown in FIG. 2, an embodiment of the present disclosure provides a chip on film bonding structure, including: a chip on film COF 10 including a first pin 100; and a flexible circuit board FPC 20 including a second pin 200, the second pin 200 being connected to the first pin 100; the first pin 100 including a first end and a second end that are arranged to be opposite to each other; the second pin 200 including a third end and a fourth end that are arranged to be opposite to each other; the first end of the first pin 100 and the third end of the second pin 200 overlap with each other to form a first active contact region A; the second end of the first pin 100 and the fourth end of the second pin 200 respectively extend outward from two opposite sides of the first active contact region A, to form a first exposed region 100a at the second end of the first pin 100 and to form a second exposed region 200a at the fourth end of the second pin 200.

In the above embodiment, the second end of the first pin 100 of the chip on film COF 10 extends out of the first active contact region A between the first pin 100 and the second pin 200 of the flexible circuit board FPC 20. In other words, the first pin 100 of the chip-on-film COF 10 is designed to have a length greater than that of the first active contact region A. As compared with the aforementioned embodiment in which only the FPC Pin is exposed but the COF Pin is not exposed (i.e., the length of the COF Pin is equal to the length of the first active contact region), the first pin 100 of the chip-on-film COF 10 is designed to have a length greater than that of the first active contact region A. In this way, since the length of the COF Pin (first pin 100) is increased, the exposed part of the FPC Pin (second pin 200) can be reduced when the length of the first active contact region A of the first pin 100 and the second pin 200 remains unchanged., This can meet the requirements on a process for bonding FPC with COF, and at the same time can alleviate the corrosion problem of the exposed part of FPC pin. Therefore, the above embodiment is conductive to reduce the poor display, improve reliability, and increase product service life.

In an optional embodiment, the first exposed region 100a has a first length L1 in the extending direction from the first end to the second end; the second exposed region 200a has a second length L2 in the extending direction from the third end to the fourth end; and both the first length L1 and the second length L2 are less than 0.3 mm.

As shown in FIG. 1, in the FPC and COF design of an embodiment, the length of FPC Pin 1 is 0.30 mm longer than COF Pin 2 to ensure the effective pin contact area. With the technical solution of FIG. 2 described above, the length of the second exposed region 200a of the FPC Pin (i.e., the second pin 200) that exposes outside the first active contact region A can be less than 0.3 mm.

Optionally, the first length L1 is in a range from 0.05 to 0.20 mm; optionally, the second length L2 is in a range from 0.1 to 0.2 mm.

With the above technical solution, the length of the first pin 100 that extends out of the first active contact region A can be in a range from 0.05 to 0.20 mm, and the length of the second pin 200 that extends out of the active contact region A can be in a range from 0.1 to 0.2 mm.

Optionally, the first length L1 is 0.1 mm; and the second length L2 is 0.1 mm.

With the technical solution in FIG. 2 above, the lengths of the COF Pin and FPC pin are both 0.1 mm longer than the length of the first active contact region A. As compared with related art, it can reduce the length of FPC pin by 0.2 mm and increases the COF pin by 0.1 mm, and at the same time, it can ensure that the length of the first active contact region A remains unchanged. This not only meets the process conditions, but also prevents FPC Pin corrosion, thereby being conductive to reduce poor display and increase the service life of the product.

Table 1 shows the reliability results obtained from the chip on film COF 10 bonding structure according to the above embodiment of the present disclosure as shown in FIG. 2, and the comparing chip on film bonding structure in the related art in which the FPC pin is designed to have a length 0.3 mm longer than that of the COF pin.

TABLE 1

| Item | Chip on film bonding structure in the related art | Chip on film bonding structure in the embodiment of the present disclosure |
|---|---|---|
| 8585 | 2/15 of Pin is corroded | No corrosion |
| THO | 2/15 of Pin is corroded | No corrosion |

The 8585 operation (namely double 85 test, which refers to the aging test at a condition of a high temperature of 85° C. and a relative humidity of 85%) and THO operation (namely a high temperature and high humidity operation test, which refers to an aging test at a condition of a high temperature of 60° C. and a relative humidity of 90%) are conducted. As shown in Table 1, it can be seen that 2/15 of the FPC pin corrosion occurs when the FPC pin shown in FIG. 1 is designed to have a length 0.3 mm longer than that of the COF pin; and in contrary the chip on film COF 10 bonding structure provided by the embodiment of the present disclosure shows no corrosion to be occurred (i.e., very good reliability result). Therefore, the chip on film COF 10 bonding structure provided by the embodiments of the present disclosure can effectively prevent FPC Pin corrosion and solve the problem of poor display screen caused by FPC Pin corrosion.

In an optional embodiment, as shown in FIG. 2, the chip on film COF 10 includes: substrate 11; a metal layer 12, arranged on the substrate 11 and connected to a driver IC; and a paint film 13, arranged on the metal layer 12 and exposing two ends of the metal layer 12, in which the exposed two ends are the first pin 100 and a third pin (not shown in the figure) to be connected to the display substrate.

The chip-on-film COF 10 bonding structure provided by the embodiments of the present disclosure is suitable for mobile terminals and various OLED display module structures, but of course it is not limited thereto.

In addition, an embodiment of the present disclosure also provides a display module, including the COF 10 bonding structure provided by the embodiment of the present disclosure. Optionally, the display module is an OLED display module.

An embodiment of the present disclosure also provides a terminal device, such as display terminal, including the display module provided by the embodiment of the present disclosure.

The following points need to be explained:
(1) The drawings of the embodiments of the present disclosure only refer to the structures related to the embodiments of the present disclosure, and other structures can refer to the general design.
(2) For the sake of clarity, in the drawings used to describe the embodiments of the present disclosure, the thicknesses of layers or regions are enlarged or reduced, that is, these drawings are not drawn according to actual scale. It will be understood that when an element, such as a layer, film, region, or substrate, is referred to as being "on" or "under" another element, the element may be directly "on" or "under" another element, or there may be an intermediate element.

(3) The embodiments in the present disclosure and the features in the embodiments can be combined with each other, as long as they contradict each other.

The above description is merely the specific embodiment of the present disclosure, but the scope of the present disclosure is not limited thereto, and the protection scope of the present disclosure should be subject to the protection scope of the claims.

What is claimed is:

1. A chip-on-film bonding structure, comprising:
a chip on film comprising a first pin, wherein the first pin comprises a first end and a second end that are arranged to be opposite to each other; and
a flexible circuit board comprising a second pin connected to the first pin, wherein the second pin comprises a third end and a fourth end that are arranged to be opposite to each other,
wherein the first end of the first pin and the third end of the second pin overlap with each other to form a first active contact region, and
the second end of the first pin and the fourth end of the second pin respectively extend outward from two opposite sides of the first active contact region, to form a first exposed region at the second end of the first pin and to form a second exposed region at the fourth end of the second pin,
wherein the first exposed region has a first length in an extending direction from the first end to the second end; the second exposed region has a second length in an extending direction from the third end to the fourth end; and both the first length and the second length are less than 0.3 mm.

2. The chip-on-film bonding structure of claim 1, wherein the first length is in a range from 0.05 to 0.20 mm.

3. The chip-on-film bonding structure of claim 2, wherein the first length is 0.1 mm.

4. The chip-on-film bonding structure of claim 1, wherein the second length is in a range from 0.1 to 0.2 mm.

5. The chip-on-film bonding structure of claim 4, wherein the second length is 0.1 mm.

6. The chip-on-film bonding structure of claim 1, wherein the chip on film comprises:
a substrate;
a metal layer, arranged on two opposite surfaces of the substrate and connected to a driving IC;
a paint film, arranged on a surface of the metal layer away from the substrate and exposing two ends of the metal layer, wherein the exposed two ends are the first pin and a third pin to be connected to a display substrate, and the third pin comprises a fifth end and a sixth end that are arranged to be opposite to each other.

7. The chip-on-film bonding structure of claim 6, wherein the chip-on-film bonding structure further comprises the display substrate comprising a fourth pin to be connected to the chip on film, and the fourth pin comprises a seventh end and an eighth end that are arranged to be opposite to each other.

8. The chip-on-film bonding structure of claim 7, wherein the fifth end of the third pin and the seventh end of the fourth pin overlap with each other to form a second active contact region; and the sixth end of the third pin and the eighth end of the fourth pin respectively extend from two opposite sides of the second active contact region, to form a third exposed region at the sixth end of the third pin and to form a fourth exposed region at the eighth end of the fourth pin.

9. The chip-on-film bonding structure of claim 8, wherein the third exposed region has a third length in an extending direction from the fifth end to the sixth end;
the fourth exposed region has a fourth length in the extending direction from the seventh end to the eighth end; and
both the third length and the fourth length are less than 0.3 mm.

10. The chip-on-film bonding structure of claim 9, wherein the third length is in a range from 0.05 to 0.20 mm.

11. The chip-on-film bonding structure of claim 10, wherein the third length is 0.1 mm.

12. The chip-on-film bonding structure of claim 9, wherein the fourth length is in a range from 0.1 to 0.2 mm.

13. The chip-on-film bonding structure of claim 12, wherein the fourth length is 0.1 mm.

14. A display module, comprising the chip-on-film bonding structure of claim 1.

15. The display module of claim 14, wherein the display module is an OLED display module.

16. A display terminal, comprising the display module of claim 14.

17. A method for bonding the chip-on-film bonding structure of claim 1, wherein the chip-on-film bonding structure comprises: a chip on film comprising a first pin, wherein the first pin comprises a first end and a second end that are arranged to be opposite to each other; and a flexible circuit board comprising a second pin connected to the first pin, wherein the second pin comprises a third end and a fourth end that are arranged to be opposite to each other,
the method comprises:
forming a first active contact region by overlapping the first end of the first pin and the third end of the second pin; and
forming a first exposed region at the second end of the first pin and forming a second exposed region at the fourth end of the second pin by respectively extending the second end of the first pin and the fourth end of the second pin outward from two opposite sides of the first active contact region.

18. The method of claim 17, wherein the chip on film comprises:
a substrate;
a metal layer, arranged on two opposite surfaces of the substrate and connected to a driving IC;
a paint film, arranged on a surface of the metal layer away from the substrate and exposing two ends of the metal layer, wherein the exposed two ends are the first pin and a third pin to be connected to a display substrate, the third pin comprises a fifth end and a sixth end that are arranged to be opposite to each other.

19. The method of claim 18, wherein the chip-on-film bonding structure further comprises the display substrate comprising a fourth pin to be connected to the chip on film, and the fourth pin comprises a seventh end and an eighth end that are arranged to be opposite to each other,
wherein the method further comprises:
forming a second active contact region by overlapping the fifth end of the third pin and the seventh end of the fourth pin; and forming a third exposed region at the sixth end of the third pin and forming a fourth exposed region at the eighth end of the fourth pin by respectively extending the sixth end of the third pin and the eighth end of the fourth pin outward from two opposite sides of the second active contact region.

\* \* \* \* \*